(12) United States Patent
Kwark et al.

(10) Patent No.: US 6,538,299 B1
(45) Date of Patent: Mar. 25, 2003

(54) SILICON-ON-INSULATOR (SOI) TRENCH PHOTODIODE

(75) Inventors: Young H. Kwark, Chappaqua, NY (US); Dan Moy, Bethel, CT (US); Mark B. Ritter, Danbury, CT (US); Dennis L. Rogers, Croton on Hudson, NY (US); Jeffrey J. Welser, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/678,315

(22) Filed: Oct. 3, 2000

(51) Int. Cl.7 ................ H01L 31/075; H01L 31/00
(52) U.S. Cl. ............ 257/458; 257/452; 257/465; 257/466; 257/656
(58) Field of Search .................. 257/443, 458, 257/461, 464, 465, 466, 653, 654, 656, 594, 347, 452

(56) References Cited

U.S. PATENT DOCUMENTS

| | | |
|---|---|---|
| 5,538,564 A | 7/1996 | Kaschmitter |
| 5,627,092 A | 5/1997 | Alsmeier et al. ........... 438/152 |
| 5,877,521 A | 3/1999 | Johnson et al. |
| 5,994,751 A | 11/1999 | Oppermann |
| 6,111,305 A * | 8/2000 | Yoshida et al. ............. 257/656 |
| 6,177,289 B1 | 1/2001 | Crow et al. ................... 438/16 |

OTHER PUBLICATIONS

Rong–Heng Yuang et al., "Overall Performance Improvement in GaAs MSM Photodetectors by Using Recessed–Cathode Structure", IEEE Photonics Technology Letters, Vol. 9, No. 2, Feb. 1997.
Jacob Y.L. Ho and K.S. Wong, "Bandwidth Enhancement in Silicon Metal–Semiconductor–Metal Photodetector by Trench Formation", IEEE Photonics Technology Letters, vol. 8, No. 8, Aug. 1996.
PCT International Search Report dated May 6, 2002.

* cited by examiner

Primary Examiner—Minh Loan Tran
(74) Attorney, Agent, or Firm—Paul Otterstedt, Esq.; McGinn & Gibb, PLLC

(57) ABSTRACT

A semiconductor device (and method for forming the device) includes a silicon-on-insulator (SOI) wafer formed on a substrate surface. An isolation trench in the wafer surface surrounds alternating p-type trenches and n-type trenches and electrically isolates the device from the substrate, thereby allowing the device to be effectively utilized as a differential detector in an optoelectronic circuit.

23 Claims, 5 Drawing Sheets

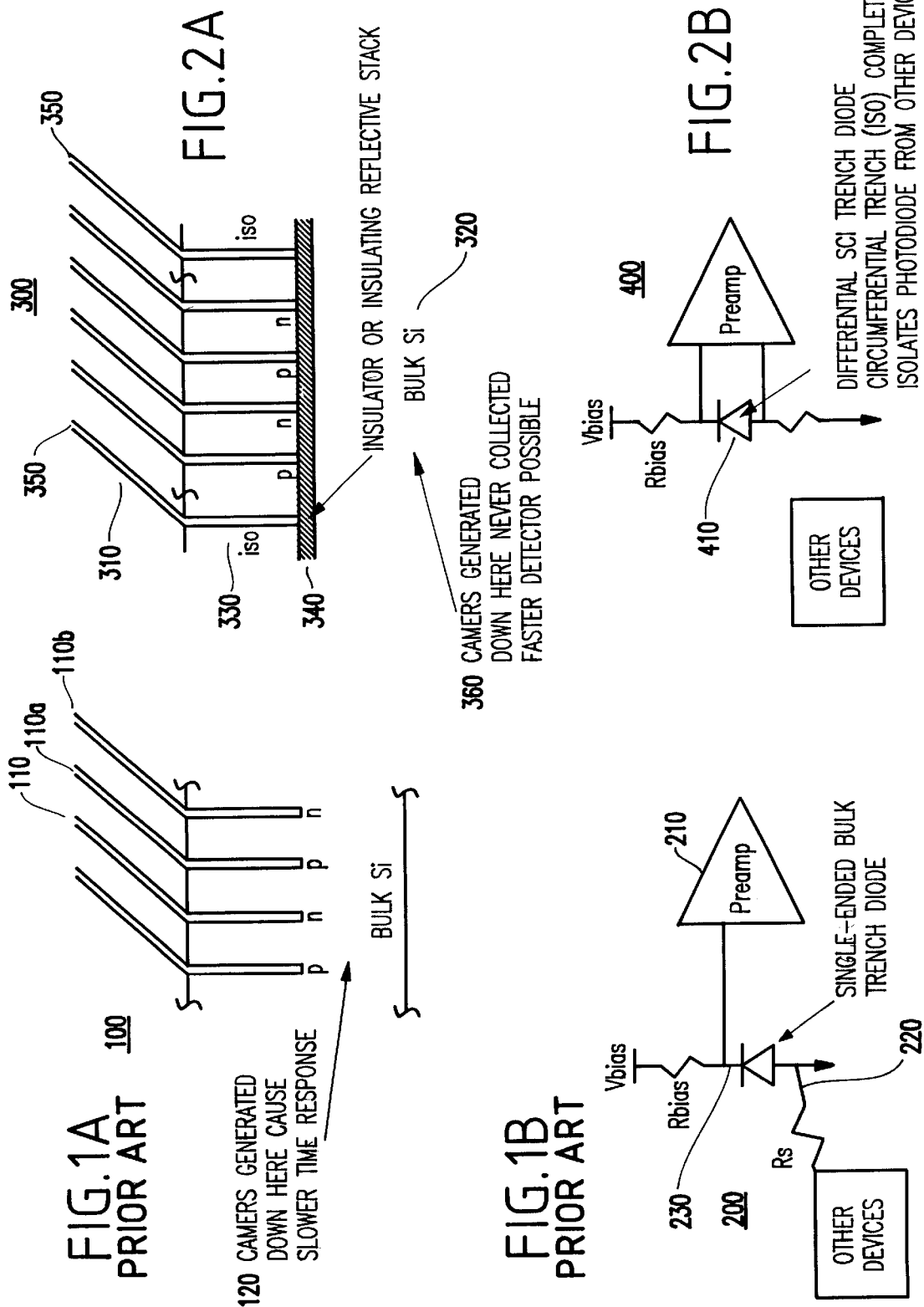

SILICON-ON-INSULATOR (SOI) TRENCH PHOTODIODE

BACKGROUND OF THE INVENTION

1. Field of the Invention

The present invention generally relates to a photodiode, and more specifically, to a silicon on insulator (SOI) photodiode, which has improved speed and differential isolation when used as a differential detector, and a method of forming such a photodiode.

2. Description of the Related Art

Photodiode detectors are often used in integrated optoelectronic circuits for noise rejection. Commonly assigned U. S. patent application Ser. No. 09/209,433 to Rogers et al. (hereinafter "Rogers") discloses a photodiode structure for use as a detector which employs lateral PIN diodes (i.e., pn junction devices with lightly doped (near intrinsic) regions placed between the typical diode p- and n-type regions) grown in deep trenches in bulk silicon. Such structures are known as "bulk trench detectors."

As shown in FIG. 1(a), the bulk trench photodiode detector 100 disclosed by Rogers is composed of an array of long, deep trench structures 110 which alternate from p-type doping 110a to n-type doping 110b, thereby forming a lateral PIN diode structure. As shown in FIG. 1(b), this means that one terminal of the diode is electrically connected to the substrate, for example, the p-terminal (anode) for p-substrates, as used by typical analog and mixed signal processes.

However, in the Rogers photodiode, the terminal which is connected to the substrate will be exposed to the substrate noise and low substrate impedance associated therewith (e.g., Rs in FIG. 1(b) denotes the impedance to substrate, typically a few 10s of ohms). Therefore, if this photodiode structure is employed as a differential detector 200 as shown in FIG. 1(b), substrate noise will be injected directly into the preamplifier 210 from the diode terminal which is connected to the substrate 220 and the impedance of that substrate node will not be the same as that of the other terminal of the diode 230. An imbalanced impedance is, therefore, created at the input. Therefore, this photodiode can operate as a single-ended detector but not as a differential detector which is preferred.

Another disadvantage of this photodiode structure is that it collects photoelectrons (i.e., carriers) 120 generated below the trench depth (i.e., beneath the volume occupied by the trench electrodes) where the diminishing electric fields will sweep the carriers to appropriate device terminals with less speed than the carriers generated between the trenches, resulting in a lower bandwidth than if the carriers are collected only from the region between the trenches.

SUMMARY OF THE INVENTION

It is, therefore, an object of the invention to provide an SOI trench photodiode structure which may be electrically isolated from the bulk substrate in an optoelectronic circuit and which does not collect carriers below the trenches and may, therefore, be utilized effectively as either a single-ended detector or as a differential detector to provide higher bandwidth and flatter frequency response in optoelectronic circuits.

In a first aspect, a semiconductor photodiode is provided, including a substrate, a wafer formed on the substrate and having a silicon layer and an insulating layer, a plurality of alternating p-doped trenches and n-doped trenches formed in the silicon layer. The photodiode has a silicon epilayer which is preferably about 8 to 15 microns thick for 850 nm signals and, for reflection, an insulator layer which is about ¼ wave thick at the signal wavelength, or about 212 nm thick for 850 nm light. The photodiode further has a set of p-doped trenches and set of n-doped trenches which are interdigitated and alternated. These trenches are also as deep as the silicon epilayer and are filled with polysilicon.

In another aspect, the photodiode has an isolation trench formed in the silicon layer and surrounding the p-doped and n-doped trenches. The trench is bounded at the bottom by the surface of the insulator layer (i.e., the trench is as deep as the silicon epilayer). In addition, the trench may be doped with either p-type or n-type dopants and filled with polysilicon or another conducting substance. The trench isolates the photodiode from other devices so that the photodiode may be used effectively as a differential detector.

In another aspect of the invention, the SOI photodiode described above is incorporated into an integrated circuit as a differential detector.

In another aspect of the invention, the isolation trench is not doped but is filled with an oxide which further isolates the photodiode.

In another aspect of the invention, the insulator layer of the SOI wafer has a dielectric reflecting stack to reflect light that has penetrated the silicon epilayer back into the trenches thereby increasing responsivity.

In another aspect of the invention, the photodiode is tilted at an angle with respect to an incoming light beam. The tilting increases the path length along which light enters the photodiode, increasing responsivity.

In another aspect of the invention, incoming light is refracted into the photodiode by placing a prismatic cover on top of the photodiode which also increases the path length along which light enters the photodiode, increasing responsivity.

In another aspect of the invention, the surface of the silicon epilayer of the SOI wafer is etched, using e.g. KOH, to form either prismatic or tetrahedral features which increases the path length along which light enters the photodiode, increasing responsivity.

In another aspect of the invention, the insulating layer on the SOI wafer is made thicker than ¼ wavelength of the signal light and is used as a slab waveguide. Light is coupled into the insulating layer from the edge of the device, and a diffraction grating directs light upward into the active photodiode layer.

In another aspect of the invention, the photodiode device is provided without an isolation trench. This particular structure cannot operate as a differential detector but provides a high speed single-ended detector.

In yet another aspect of the invention, a method is provided for forming the SOI trench photodiode according to its several embodiments.

With its unique and unobvious features, the present invention provides a high speed photodiode that can be electrically isolated from the bulk substrate and, therefore, insensitive to substrate currents injected by other circuits fabricated in the epilayer. In addition, the inventive photodiode does not collect carriers below the trenches and is, therefore, faster than coventional photodiodes and has a flatter frequency response to lower frequencies, thereby reducing inter-symbol interference.

BRIEF DESCRIPTION OF THE DRAWINGS

The foregoing and other objects, aspects and advantages will be better understood from the following detailed description of a preferred embodiment of the invention with reference to the drawings, in which:

FIG. 1(a) shows the lateral PIN diode structure of a conventional bulk trench photodiode;

FIG. 1(b) shows a symbolic equivalent of the conventional photodiode;

FIG. 2(a) shows the circumferential trench isolation structure of a photodiode according a first embodiment of the present invention;

FIG. 2(b) shows a symbolic equivalent of the photodiode according to a first embodiment of the present invention;

DETAILED DESCRIPTION OF THE PREFERRED EMBODIMENTS OF THE INVENTION

Figure 3:
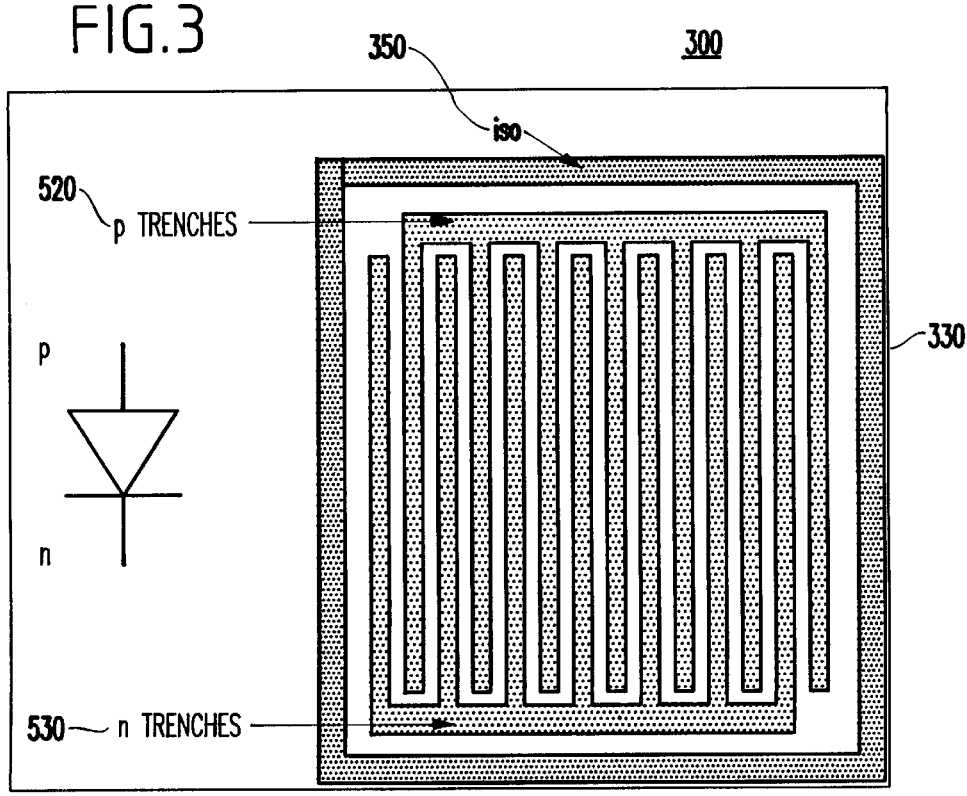
FIG. 3 shows a top view of the circumferential trench isolation structure of a photodiode according to a first embodiment of the present invention.

Referring now to the drawings, FIG. 2(a) illustrates an SOI trench photodiode 300 according to a preferred embodiment of the present invention.

Generally, as shown in FIG. 2(a) the trench photodiode according to the preferred embodiment of the present invention includes an SOI wafer 310 formed on a silicon substrate 320. The wafer 310 includes a silicon epilayer 330 which is preferably about 8 microns thick (the top-surface active layer of the bonded SOI wafer will be referred to as an "epilayer" herein).

Beneath the epilayer is an insulator layer 340 which is preferably about ¼ of the signal light wavelength (e.g., roughly 212 nm thick for 850 nm signal wavelength). The insulating layer 340 on the silicon wafer 310 may be, e.g., silicon oxide, sapphire or any other insulating material on which silicon may be bonded or grown and which is commonly used in the art. Other dimensions of the wafer such as thickness, length and width, are standard wafer dimensions in the semiconductor industry.

The SOI wafer 310 may be either a bonded wafer (i.e., formed by bonding the oxide layers of two separate silicon wafers together by annealing) or a Silicon-Implanted with Oxygen (SIMOX) wafer (i.e., formed by implanting oxygen molecules into a few thousand angstroms of silicon on top of an insulator and then growing the silicon on top thicker).

As shown in FIG. 2(a), an isolation trench 350 may be formed in the silicon epilayer 330 of the wafer 310 and around the perimeter of the detector. The depth of this isolation trench 350 is generally within a range of 3 to 12 microns, and preferably, about 8 microns deep which is the standard for deep trench processing and which has reasonably good responsivity at 850 nm which is the standard wavelength for short wavelength fiberoptic links. The isolation trench 350 surrounds and acts to electronically isolate the photodiode 300, and needs only be wide enough to provide this electrical isolation, typically 0.1 to 0.5 um wide.

FIG. 2(b) shows a symbolic equivalent of the inventive photodiode and specifically indicates the electrical isolation of the device from other devices caused by the isolation trench 350. This isolation allows the inventive photodiode to be used as a differential detector 410 in an optoelectrical circuit 400.

It is preferred that the isolation trench 350 is formed as deep as the silicon epilayer 330. In other words, the bottom of the isolation trench is the top of the insulator layer. This helps to ensure that the carriers injected into the epilayer by other electronic devices formed in regions adjacent to the photodiode do not reach the sensitive photodiode device. Therefore, the device less susceptible to coupled noise from other circuits fabricated along with the photodetector. In fact, even if the isolation trenches are not as deep as the epilayer, isolation is improved over the standard bulk trench detector design 100.

In addition, the surface of the isolation trench 350 is either p-doped or n-doped, depending on whether the substrate onto which the wafer is bonded is p-type or n-type. For example, if the substrate is p-type, the surface of the isolation trench 350 is n-doped and the isolation trench 350 would be connected to a quiet Vdd to isolate the photodiode. Conversely, for an n-type substrate, the surface of the isolation trench 350 is p-doped, in which case the isolation trench 350 would be connected to a quiet ground.

As shown in FIG. 3, the wafer epilayer 330 additionally has a set of p-type trenches 520 and n-type trenches 530 which are surrounded by the isolation trench 350. As shown, the two sets of trenches 520, 530 are alternating and interdigitated to form a lateral diode with PINIPIN doping, where I is the intrinsic substrate doping. The trenches 520, 530 are preferably formed about 8 microns deep and about ½ of a micron wide. The 1/e absorption depth for 850 nm light in silicon to about 15 microns. Thus, for a trench depth of 8 microns, about 40% of the light contacting the photodiode detector will generate carriers below the trenches.

The alternating trenches 520, 530 are preferably filled with polysilicon, and metallization is then deposited to contact the polysilicon at the top of the trenches. This allows the metallization to contact the entire length of the trench, and is most compatible with existing processes. (Note that the metallization could be deposited into the alternating trenches 520, 530 to contact the doped semiconductor. Although this would reduce the parasitic series resistance presented by the doped polysilicon in the trenches and increase the speed of the photodiode, this process is costly and, therefore, polysilicon is used in the preferred embodiment).

In addition, the inventors have found that the inventive photodiode can be formed without an isolation trench so as to operate not as a differential detector, but as a high speed single-ended detector.

Furthermore, the responsivity of the photodiode 300 can be increased using any of several alternative methods which seek to guide or deflect light away from simple normal incidence to a more oblique angle, preferably in a direction parallel to the long axis of the trench electrodes. This has the effect of increasing the optical path length available to generate carriers without requiring significantly greater electrode area. Larger electrode areas would increase detector capacitance with adverse impact on electrical performance.

This unique and unobvious design results in a photodiode 300 which is electrically isolated from the bulk substrate 320 and, therefore, does not inject substrate noise into the circuit. In addition, the inventive photodiode does not collect carriers 360 below the trenches 520, 530 and is, therefore, faster than coventional photodiodes.

It is noted that, in a modification of the above, the isolation trench 350 could be left undoped and still provide greater isolation than conventional devices. Further, an oxide could be grown in the undoped isolation trench 350 which would isolate the photodiode 300 even more effectively than a doped trench.

Further, the photodiode 300 could be tilted at an angle with respect to the incoming light beam. Depending on the degree to which the light is collimated, the path length is increased by 1/(cos q) where q is the tilt angle. There will be some "edge" effects at the perimeter of the photodiode where this increase will not be effective, but this will usually be a small fraction of the entire area for most geometries.

Figure 4:
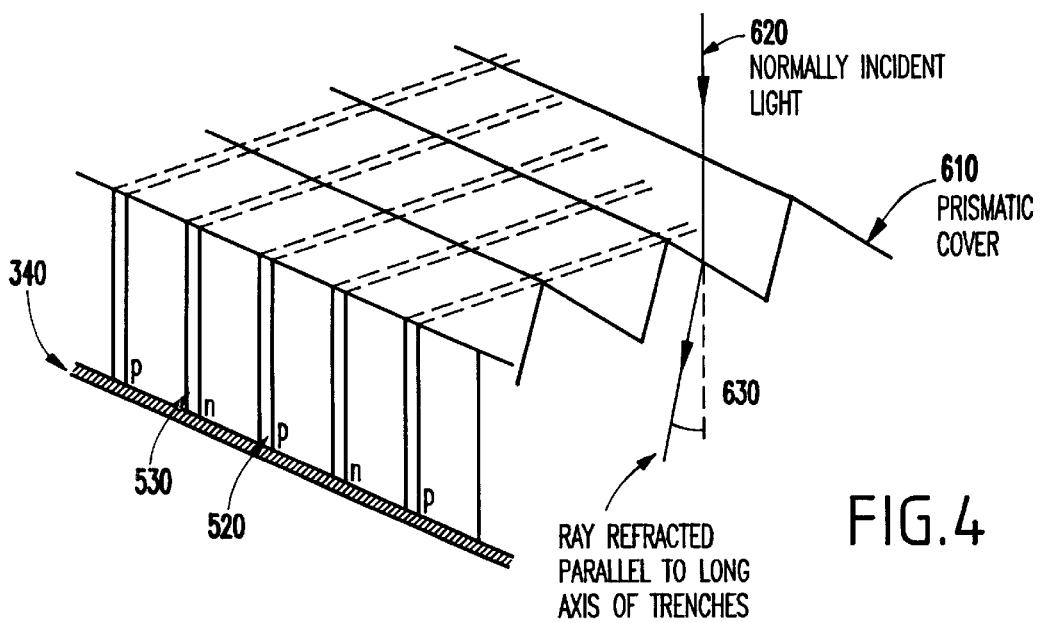
FIG. 4 shows an SOI trench photodiode with a prismatic cover according to a first embodiment of the present invention.

Additionally, a prismatic cover 610 as shown in FIG. 4 could be a fixed to the top of the finished photodiode 300. The cover refracts normally incident incoming light 620 (according to Snell's law) to create the oblique light path 630 into the photodiode 300.

Figure 5:
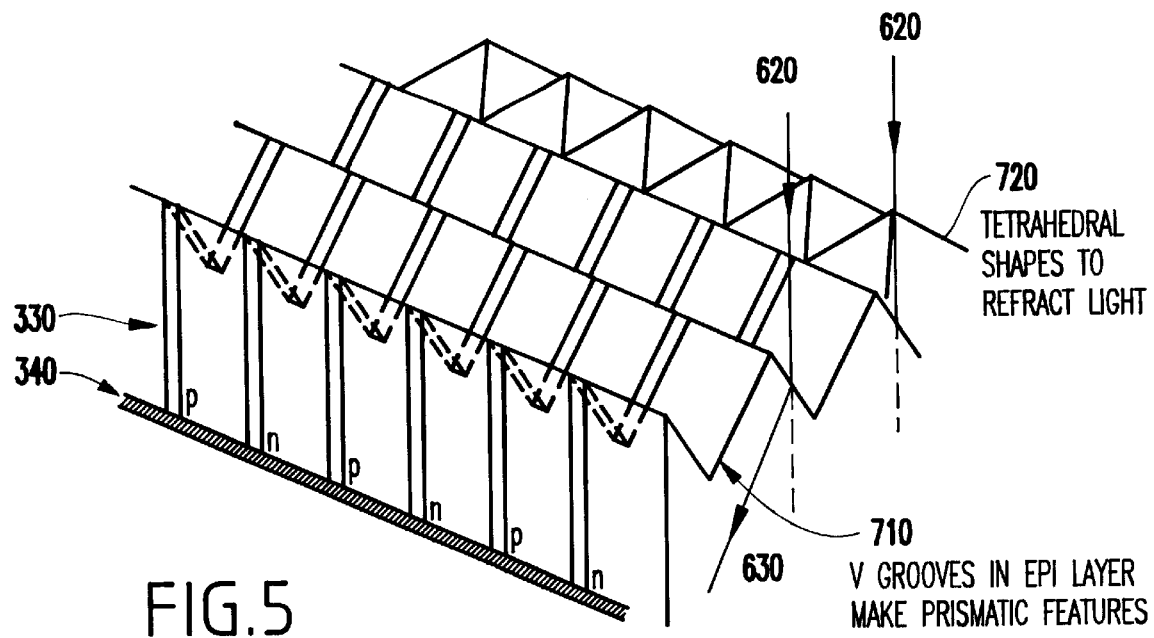
FIG. 5 shows an SOI trench photodiode with an etched silicon epilayer according to a first embodiment of the present invention.

Moreover, instead of using the prismatic cover 610, the inventive photodiode could have a silicon epilayer 330 of the SOI wafer 310 that is etched (by using, for example, potassium hydroxide) to form either prismatic 710 or tetrahedral 720 features as shown in FIG. 5. Like the above-mentioned prismatic cover 610, this etching creates an oblique light path 630, increasing responsivity. However, this structure has the disadvantage of having a non-planar surface for subsequent processing, and would require additional care to maintain surface passivation and metal line integrity for connections to the doped trenches.

In all of these configurations, the insulating layer 340 can be enhanced to act as a backside reflector. This can result in a photogeneration region bounded on top and bottom by reflective layers, acting either as Bragg reflectors or by total internal reflection respectively. Therefore, the quantum efficiency of the photodiode 300 is greatly enhanced without increasing the electrode capacitance.

Figure 6:
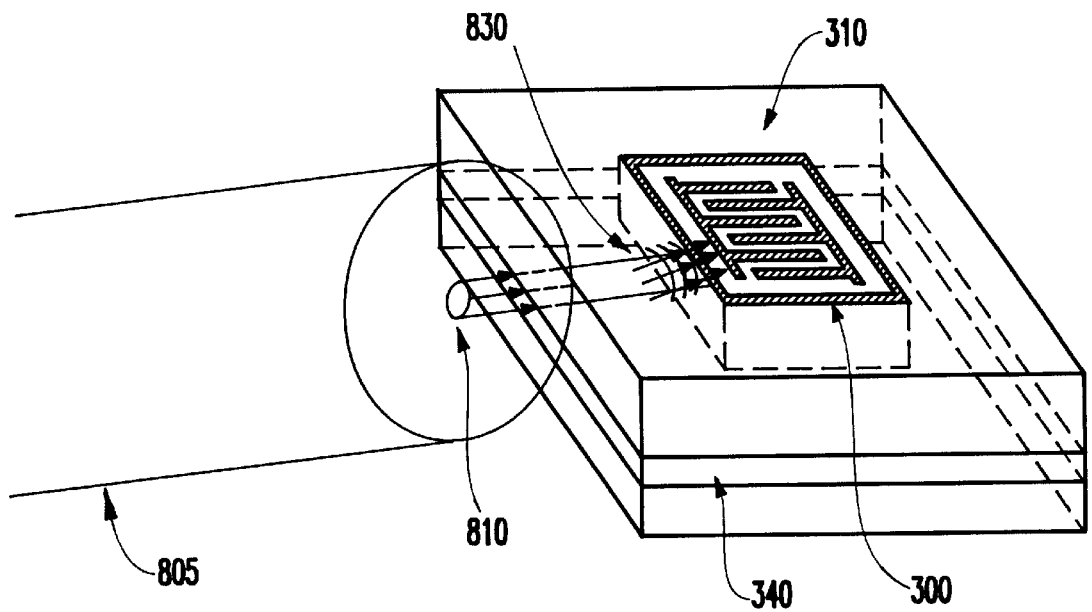
FIG. 6 shows an SOI trench photodiode having a thick insulating layer for a waveguide according to the first embodiment of the present invention.

Furthermore, as shown in FIG. 6, the SOI wafer 310 could include a thicker insulating layer 340 and a diffraction grating 830. Specifically, the insulating layer 340 could be formed sufficiently thick (about 10 microns) to accept light from the core 810 of a butt-coupled fiber 805, or from an optical lensing system to focus the light into the thick insulating layer 340, so that the light is guided using the insulating layer 340 as a waveguide. The diffraction grating 830 could be formed in the insulating layer 340 by ion implantation or other methods. The diffraction grating 830 diffracts the light in the waveguide up to the photodetector 300. This particular configuration can easily be used in photodetector arrays that are integrated with silicon circuitry.

Figure 7:
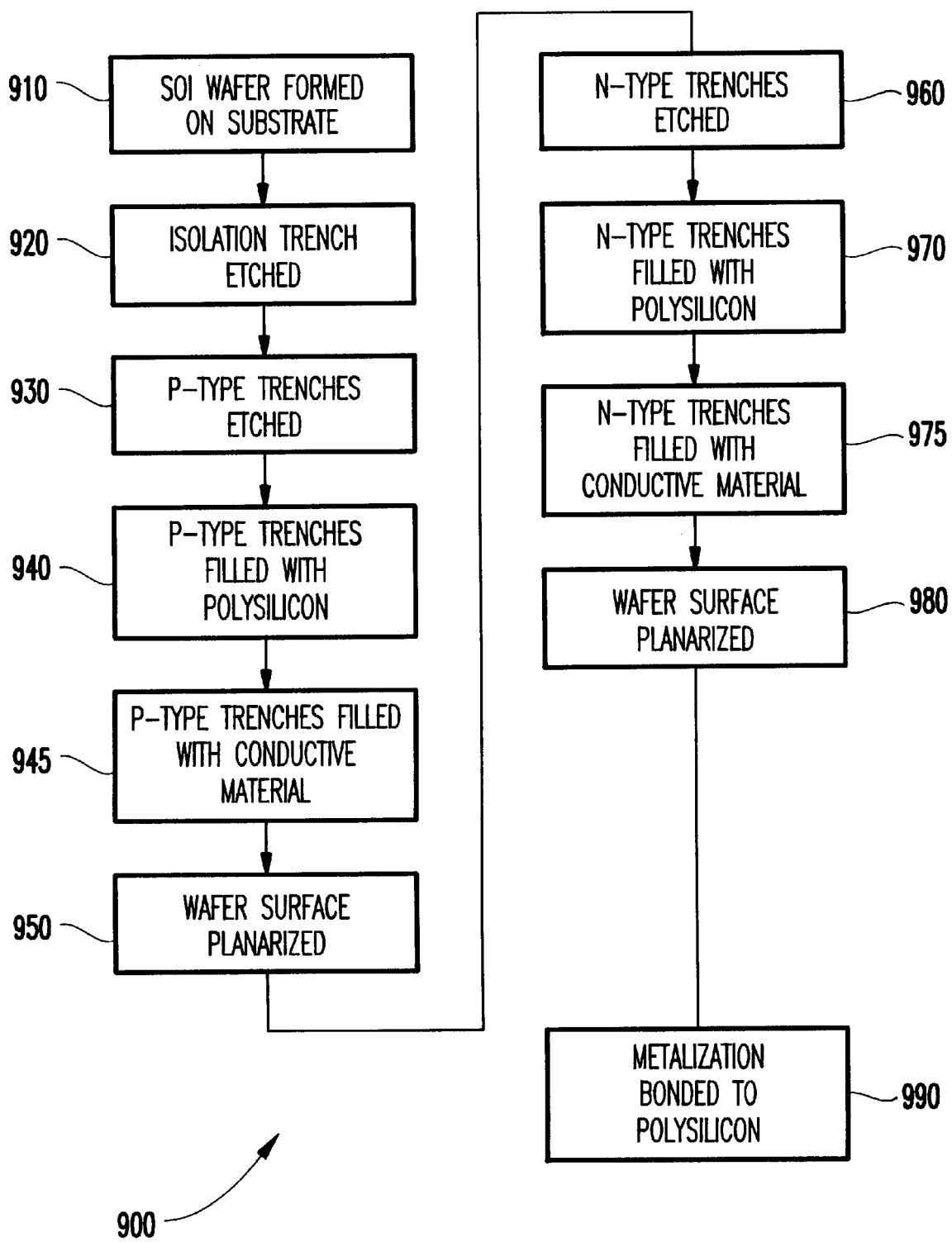
FIG. 7 shows a flow diagram illustrating a preferred method for forming an SOI trench photodiode according to a first embodiment of the present invention.

FIG. 7 is a flow chart illustrating a preferred method 900 for forming the inventive photodiode 300. The method includes forming 910 the SOI wafer on a substrate. Further, the isolation trench is etched 920 into the surface and around the perimeter of the SOI wafer using a conventional etching method.

Figure 8A:
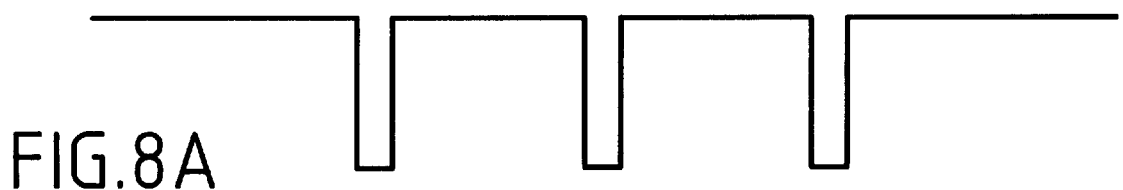
FIG. 8 shows n-type and p-type trenches as formed according to a preferred method for forming an SOI trench photodiode according to a first embodiment of the present invention.

The p-type trenches are then etched 930 in the SOI wafer, as indicated in FIG. 8(a). The trenches are formed preferably about 8 microns deep with a width as narrow as feasible compatible with the etching technology, typically 0.5 microns wide.

Figure 8B:
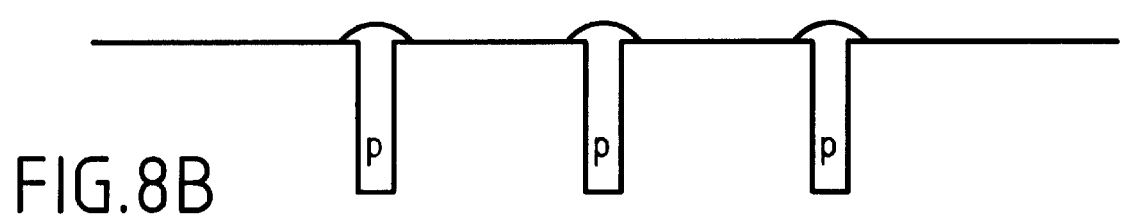

As shown in FIG. 8(b), the trenches are then filled 940 with a p-type polysilicon. As an alternative, the walls of the trenches may be doped p-type by ion implantation, or diffusion of a p-type material deposited in the trenches.

The p-type trenches are then filled 945 with a conductive material which acts as one of the electrodes of the photodiode. The surface of the wafer is then planarized 950 by polishing.

Figure 8C:
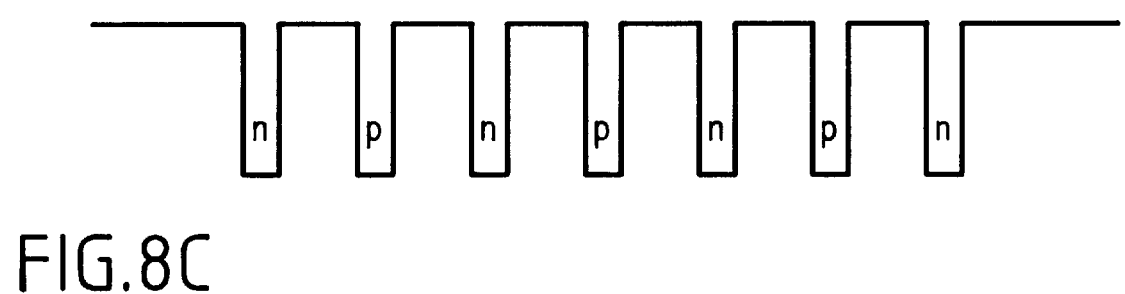

As shown in FIG. 8(c), in step 960 through 980, steps 930 through 950 are repeated to deposit n-type material into the other trenches so as to form the n-type trenches.

Metallization is then bonded 990, to the polysilicon or other conductive material at the top of the trenches.

Alternatively, both the p-type and n-type trenches could be etched in the same step, and a photoresist used to block alternate trenches. In that case, the open trenches would be processed as in steps 930 to 690 with a p-type material. The photoresist would then be removed and a second photoresist layer would be applied to cover the trenches already processed. An n-type material would then be deposited in the empty set of alternating trenches as in steps 960 through 980. The photoresist would be removed and, after the wafer is polished if needed, metallization would be bonded to the polysilicon or other conductive material at the top of the trenches. During this process, the isolation trench 350 would be doped with n-type material or a p-type material, depending on whether the substrate was p-substrate or n+substrate, as explained above.

Alternatively, the isolation trench 350 could be left undoped and empty or, a thin thermal oxide layer may be formed on the walls of the isolation trench 350. Any of the above measures may provide adequate isolation of the photodiode 300 from circuits in the surrounding epilayer:

Its unique and unobvious features electrically isolate the inventive photodiode from the bulk substrate and, therefore, prevent the photodiode from receiving substrate noise injected from the rest of the circuit. In addition, these features prevent the inventive photodiode from collecting carriers below the trenches, thereby making it faster than coventional photodiodes. Moreover, as shown above, if the insulating layer thickness is properly designed to act as a reflector for the wavelength of interest, and/or if the surface of the diode is modified to redirect normally incident light at a more oblique angle, the responsivity of the diode will be increased even further with no increase in device capacitance.

While the invention has been described in terms of preferred embodiments, those skilled in the art will recognize that the invention can be practiced with modification within the spirit and scope of the appended claims.

What is claimed is:

1. A semiconductor device for photodetection comprising:
   a substrate;
   a wafer formed on said substrate, said wafer having a silicon layer and an insulating layer;
   a plurality of alternating p-doped trenches and n-doped trenches and an isolation trench formed in said silicon layer of said wafer;
   a polysilicon layer formed in said alternating p-doped trenches and n-doped trenches for connecting to metallization.

2. The semiconductor device according to claim 1, wherein said substrate comprises silicon.

3. The semiconductor device according to claim 1, wherein a thickness of said silicon layer is substantially 8 microns.

4. The semiconductor device according to claim 1, wherein said semiconductor device is tilted to a predetermined angle in a direction parallel to a long axis of said p-doped trenches and said n-doped trenches, and wherein a light beam is directed to said semiconductor device and is deflected at an angle which is more oblique than normal incidence.

5. The semiconductor device according to claim 1, further comprising:

a prismatic cover which covers said silicon layer for refracting an incoming light beam.

6. The semiconductor device according to claim 1, wherein prismatic or tetrahedral features are anisotropically etched on a surface of said silicon layer for refracting an incoming light beam.

7. The semiconductor device according to claim 1, further comprising:

a dielectric stack formed in said insulating layer for selectively reflecting light into said alternating p-doped trenches and n-doped trenches designed to reflect unabsorbed light of the signal wavelength, thereby increasing the quantum efficiency of the structure without imposing a capacitance penalty.

8. The semiconductor device according to claim 1, wherein said insulating layer comprises a thick insulating layer which acts as a waveguide; and said device further comprises:

a diffraction grating formed in said thick insulating layer to diffract light at the signal wavelength into the semiconductor device.

9. The semiconductor device according to claim 1, wherein said isolation trench comprises a p-doped or n-doped isolation trench formed in said silicon layer of said wafer and surrounding said alternating p-doped trenches and n-doped trenches.

10. The semiconductor device according to claim 9, wherein said substrate comprises silicon.

11. The semiconductor device according to claim 9, wherein said isolation trench electrically insulates said semiconductor device from said substrate.

12. The semiconductor device according to claim 9, wherein said substrate comprises a p-type substrate, and wherein said isolation trench comprises an n-doped trench and is coupled to receive a predetermined voltage.

13. The semiconductor device according to claim 9, wherein said substrate comprises an n-type substrate, and wherein said isolation trench comprises a p-doped trench and is coupled to receive a predetermined voltage.

14. The semiconductor device according to claim 9, further comprising:

a silicon oxide layer grown on a surface of said isolation trench.

15. The semiconductor device according to claim 9, wherein a thickness of said silicon layer is substantially 8 microns.

16. The semiconductor device according to claim 9, wherein said semiconductor device is tilted to a predetermined angle in a direction parallel to a long axis of said p-doped trenches and said n-doped trenches, and wherein a light beam is directed to said semiconductor device and is deflected at an angle which is more oblique than normal incidence.

17. The semiconductor device according to claim 9, further comprising:

a prismatic cover which covers said silicon layer for refracting an incoming light beam.

18. The semiconductor device according to claim 9, wherein prismatic or tetrahedral features are anisotropically etched on a surface of said silicon layer for refracting an incoming light beam.

19. The semiconductor device according to claim 9, further comprising:

a dielectric stack formed in said insulating layer for selectively reflecting light into said alternating p-doped trenches and n-doped trenches designed to reflect unabsorbed light of the signal wavelength, thereby increasing the quantum efficiency of the structure without imposing a capacitance penalty.

20. The semiconductor device according to claim 9, wherein a thickness of said silicon layer is equal to a depth of said isolation trench.

21. The semiconductor device according to claim 9, wherein said insulating layer comprises a thick insulating layer which acts as a waveguide; and said device further comprises:

a diffraction grafting formed in said thick insulating layer to diffract light at the signal wavelength into the semiconductor device.

22. The semiconductor device of claim 9, wherein said p-doped trenches comprise trenches having p-doped walls and said n-doped trenches comprise trenches having n-doped walls.

23. The semiconductor device of claim 1, wherein said p-doped trenches comprise trenches having p-type material diffused therein, and said n-doped trenches comprise trenches having n-type material diffused therein, and wherein said polysilicon layer is formed on said p-type material and said n-type material in said trenches.

* * * * *